(12) United States Patent
Chang

(10) Patent No.: US 12,526,984 B2
(45) Date of Patent: Jan. 13, 2026

(54) SEMICONDUCTOR STRUCTURE AND METHOD OF MANUFACTURING THE SAME

(71) Applicant: NANYA TECHNOLOGY CORPORATION, New Taipei (TW)

(72) Inventor: Szu-Yao Chang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 817 days.

(21) Appl. No.: 17/862,537

(22) Filed: Jul. 12, 2022

(65) Prior Publication Data

US 2024/0023315 A1    Jan. 18, 2024

(51) Int. Cl.
*H10B 12/00*    (2023.01)

(52) U.S. Cl.
CPC .......... *H10B 12/373* (2023.02); *H10B 12/05* (2023.02)

(58) Field of Classification Search
CPC ...... H10B 12/038–0383; H10B 12/373; H10B 12/182; H10B 12/488
See application file for complete search history.

(56) References Cited

U.S. PATENT DOCUMENTS

| 10,181,472 B1* | 1/2019 | Huang ................... H10D 30/63 |
| 2018/0247943 A1 | 8/2018 | Feng et al. |
| 2021/0296319 A1 | 9/2021 | Sukekawa |
| 2022/0173135 A1* | 6/2022 | Mariani ............. H10B 12/0383 |
| 2022/0285350 A1* | 9/2022 | Okajima ............ H10D 30/6755 |

FOREIGN PATENT DOCUMENTS

| TW | 200816389 A | 4/2008 |
| TW | 200947624 A | 11/2009 |

OTHER PUBLICATIONS

Office Action dated on Mar. 29, 2023 related to Taiwanese Application No. 111149967.

* cited by examiner

*Primary Examiner* — Chad M Dicke
*Assistant Examiner* — Dave Tan
(74) *Attorney, Agent, or Firm* — Xuan Zhang

(57) ABSTRACT

A semiconductor structure and a method of manufacturing a semiconductor structure are provided. The semiconductor structure includes a substrate, an upper structure, a vertical transistor an electrical pad. The upper structure is disposed on the substrate and defines a hole. The vertical transistor is disposed in the hole. The electrical pad is disposed in the hole and on the vertical transistor. A top surface of the electrical pad is substantially aligned with a topmost surface of the upper structure.

20 Claims, 13 Drawing Sheets

SEMICONDUCTOR STRUCTURE AND METHOD OF MANUFACTURING THE SAME

TECHNICAL FIELD

The present disclosure relates to a semiconductor structure and a method of manufacturing the same, and more particularly, to a semiconductor structure including an electrical pad, and a method of manufacturing the same.

DISCUSSION OF THE BACKGROUND

Semiconductor structures are used in a variety of electronic applications, and the dimensions of semiconductor structures are continuously being scaled down to meet the current application requirements. However, a variety of issues arise during the scaling-down process and impact the final electrical characteristics, quality, cost and yield. Typical memory devices (such as dynamic random access memory (DRAM) devices) include signal lines, such as word lines and bit lines crossing the word lines. As DRAM devices are scaled down and the dimensions and/or pitches of the signal lines are getting smaller, the complicated manufacturing process and high manufacturing cost will be a critical concern.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor structure including a substrate, an upper structure, a vertical transistor an electrical pad. The upper structure is disposed on the substrate and defines a hole. The vertical transistor is disposed in the hole. The electrical pad is disposed in the hole and on the vertical transistor. A top surface of the electrical pad is substantially aligned with a topmost surface of the upper structure.

Another aspect of the present disclosure provides a semiconductor structure including a substrate, a vertical transistor, an electrical pad and a bit line. The substrate includes a capacitor. The vertical transistor is disposed on the substrate, and electrically connected to the capacitor. The electrical pad is disposed on the vertical transistor. The electrical pad has a consistent thickness. The bit line is electrically connected to the electrical pad.

Another aspect of the present disclosure provides a method of manufacturing a semiconductor structure. The method includes providing a stacked structure including a substrate and an upper structure disposed on the substrate. The method also includes forming a hole to extend through the upper structure. The method also includes forming a hole to extend through the upper structure. The method also includes forming a vertical transistor in the hole. The method also includes forming an electrical pad in the hole and on the vertical transistor. The method also includes forming a conductive structure on the electrical pad, wherein a top corner of the electrical pad is free from damage.

In some embodiments, the substrate includes a capacitor, and the vertical transistor is electrically connected to the capacitor.

In some embodiments, the upper structure includes a bottom insulation layer disposed on the substrate, a conductive layer disposed on the bottom insulation layer and a top insulation layer disposed on the conductive layer.

In some embodiments, after the vertical transistor is formed in the hole, an upper portion of the vertical transistor is removed to form a recess.

In some embodiments, the electrical pad is formed in the recess.

In some embodiments, a top surface of the electrical pad is substantially aligned with a top surface of the upper structure.

In some embodiments, a portion of the conductive structure contacts a top surface of the upper structure, and a bottom surface of the conductive structure is leveled with a top surface of the electrical pad and a top surface of the upper structure.

By forming a conductive structure on the electrical pad directly, the manufacturing method is simplified, and the manufacturing cost is lowered.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
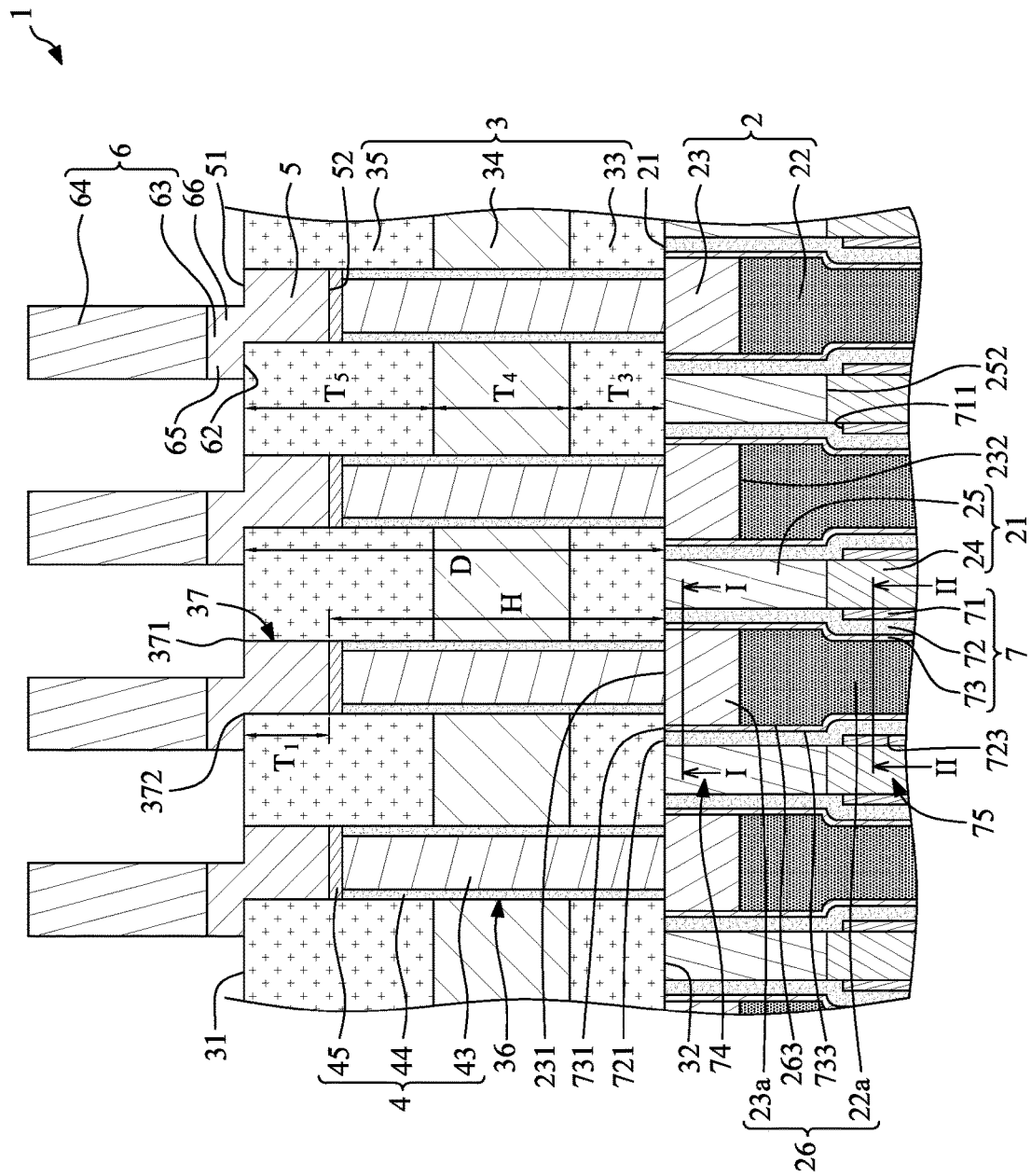
FIG. 1A is a schematic cross-sectional view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
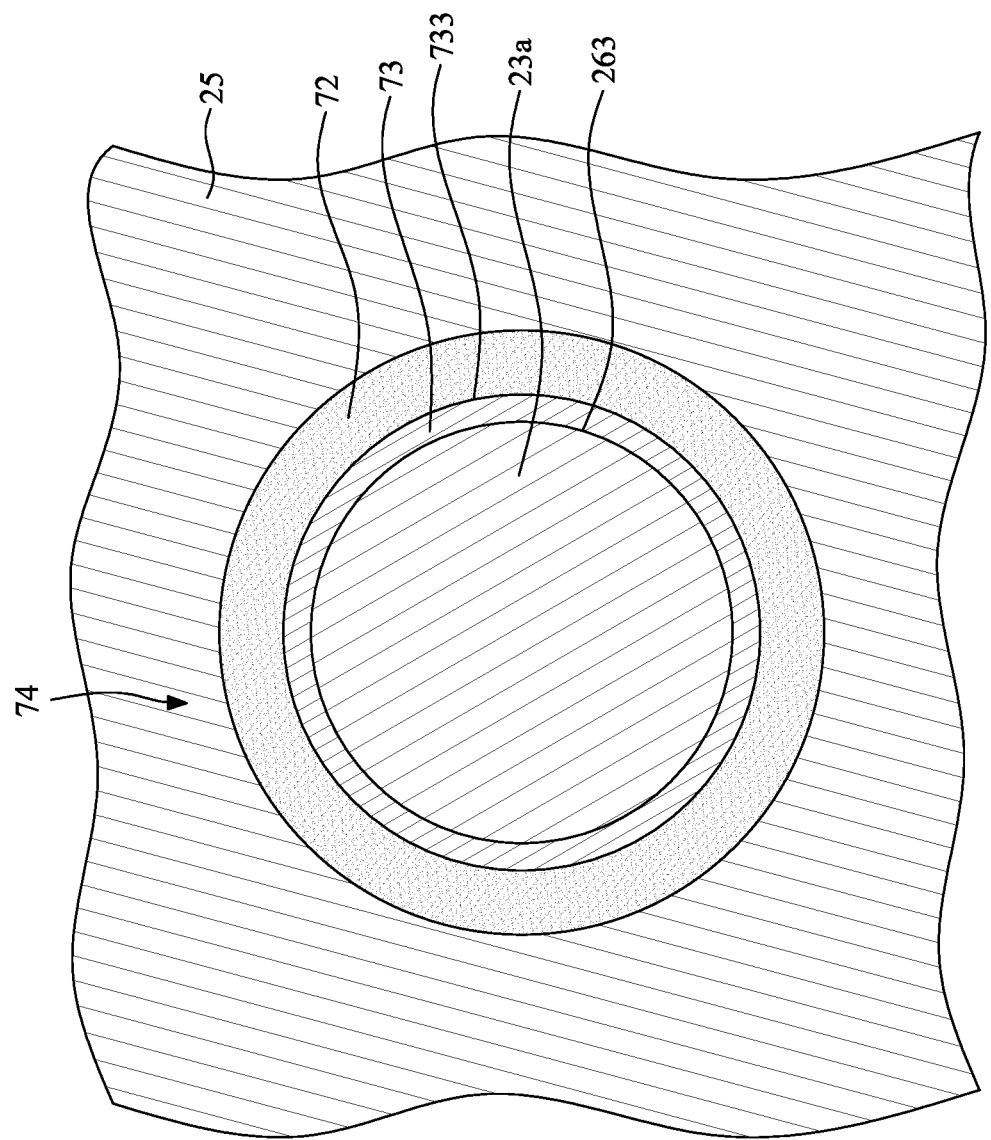
FIG. 1B is a schematic cross-sectional view of an upper portion of the capacitor of the semiconductor structure taken along line I-I of FIG. 1A.
Figure 1C:
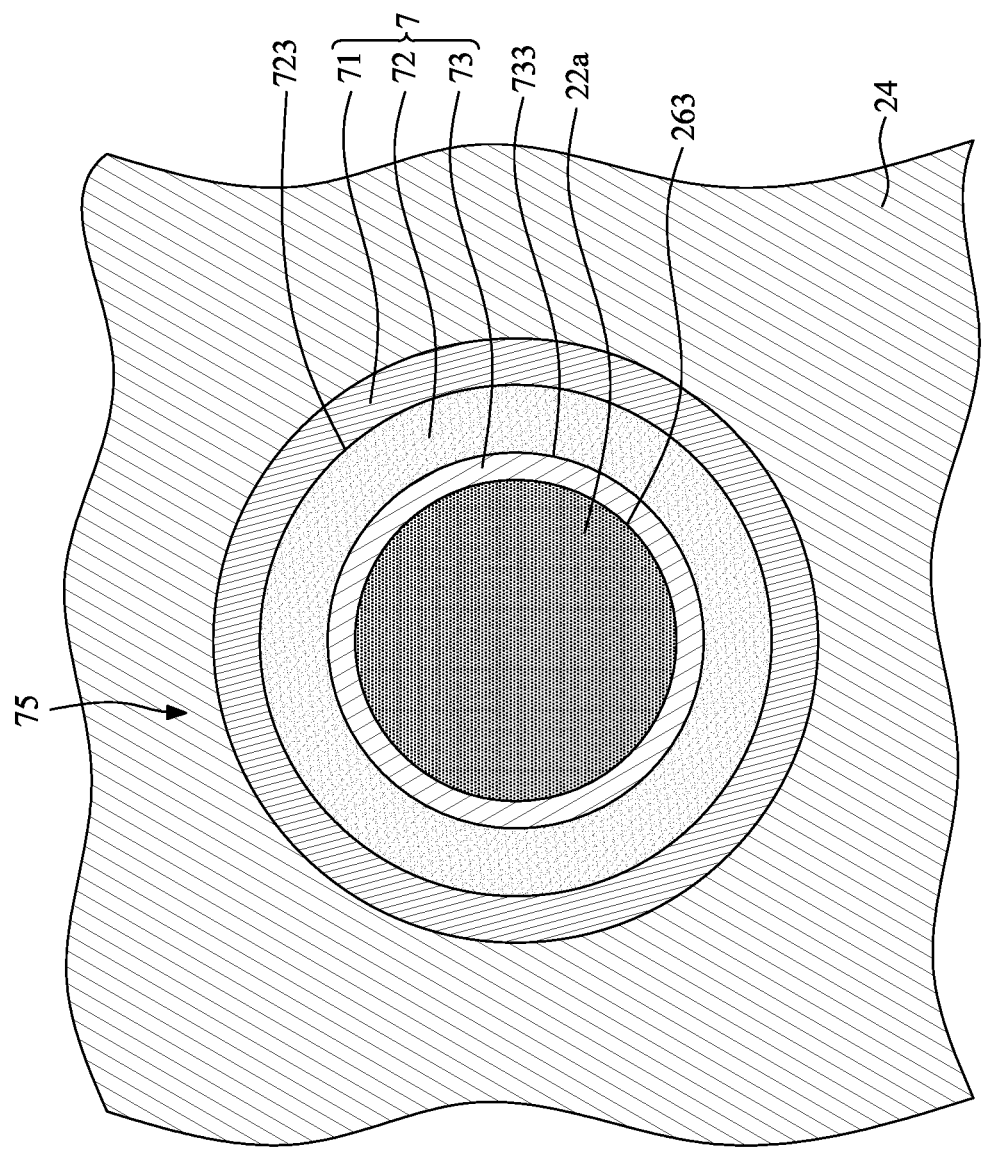
FIG. 1C is a schematic cross-sectional view of a lower portion of the capacitor of the semiconductor structure taken along line II-II of FIG. 1A.

FIG. 1A is a schematic cross-sectional view of a semiconductor structure 1 in accordance with some embodiments of the present disclosure. FIG. 1B is a schematic cross-sectional view of an upper portion 74 of the capacitor 7 of the semiconductor structure 1 taken along line I-I of FIG. 1A. FIG. 1C is a schematic cross-sectional view of a lower portion 75 of the capacitor 7 of the semiconductor structure 1 taken along line II-II of FIG. 1A.

In some embodiments, the semiconductor structure 1 may be a semiconductor device that includes a circuit, such as a memory cell. In some embodiments, the memory cell may include a dynamic random access memory cell (DRAM cell).

In addition, the semiconductor structure 1 may be or include a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

The semiconductor structure 1 may include a substrate 2 (e.g., a semiconductor substrate), an upper structure 3, a vertical transistor 4 and an electrical pad 5.

In some embodiments, the substrate 2 may have a top surface 21, and may include a base portion 22 and a conductive material 23 on the base portion 22. The base portion 22 may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the base portion 22 may include a semiconductor-on-insulator substrate, such as a silicon-on-insulator (SOI) substrate, a silicon germanium-on-insulator (SGOI) substrate, or a germanium-on-insulator (GOI) substrate.

Depending on the IC fabrication stage, the base portion 22 may include various material layers (e.g., dielectric layers, semiconductor layers, and/or conductive layers) configured to form IC features (e.g., doped regions, isolation features, gate features, source/drain features, interconnect features, other features, or combinations thereof).

In some embodiments, the conductive material 23 may include a suitable conductive material. For example, the conductive material 23 may include tungsten (W), copper (Cu), aluminum (Al), silver (Ag), an alloy thereof, or a combination thereof. In some embodiments, the conductive material 23 may include transparent conductive oxide (TCO) material, such as indium tin oxide (ITO) and zinc oxide (ZnO).

As shown in FIG. 1A, the substrate 2 may further include at least one capacitor 7 disposed therein. The capacitor 7 may be embedded in the substrate 2. In some embodiments, the capacitor 7 may be a vertical ring structure and surrounds a central portion 26. The central portion 26 may be in a cylinder shape, and may include a base material 22$a$ and a conductive material 23$a$. The base material 22$a$ of the central portion 26 may be a portion of the base portion 22 of the substrate 2. The conductive material 23$a$ of the central portion 26 may be disposed on the base material 22$a$ and electrically connected to the vertical transistor 4. The conductive material 23$a$ of the central portion 26 may be a portion of the conductive material 23 of the substrate 2.

The capacitor 7 may include a first electrode 71 (e.g., a bottom electrode), an intermediate layer 72 and a second electrode 73 (e.g., a top electrode). It is contemplated that the number of the capacitor 7 is not limited. There may be a plurality of capacitors 7 in the substrate 2. The substrate 2 may further include filling material 27 between the capacitors 7.

The second electrode 73 may be a conductive layer such as titanium nitride (TiN) layer. The second electrode 73 may be disposed on and surround the lateral surface 263 of the central portion 26. Thus, the second electrode 73 may be interposed between the central portion 26 and the intermediate layer 72. Further, the intermediate layer 72 may be a high-k dielectric layer such as zirconium oxide (ZrO$_2$) layer. The intermediate layer 72 may be disposed on and surround the lateral surface 733 of the second electrode 73. Thus, the intermediate layer 72 may be interposed between the second electrode 73 and the first electrode 71. Further, the first electrode 71 may be a conductive layer such as titanium nitride (TiN) layer. The first electrode 71 may be disposed on and surround the lateral surface 723 of the intermediate layer 72. Thus, the first electrode 71 may be interposed between the intermediate layer 72 and the filling material 27.

The filling material 27 may include a lower portion 24 and an upper portion 25 disposed on the lower portion 24. The lower portion 24 may be a dielectric material or an insulation material, and may include silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof. The upper portion 25 may be a dielectric material or an insulation material, and may include silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof. The material of the upper portion 25 may be same as or different from the material of the lower portion 24.

In some embodiments, the conductive material 23a of the central portion 26 contacts the second electrode 73. Thus, the vertical transistor 4 is electrically connected to the capacitor 7 through the conductive material 23a of the central portion 26. As shown in FIG. 1A, a top surface 231 of the conductive material 23a of the central portion 26 (or a top surface 231 of the conductive material 23 of the substrate 2), a top surface 731 of the second electrode 73 and a top surface 721 of the intermediate layer 72 may be substantially coplanar with each other. Thus, the top surface 21 of the substrate 2 may include the top surface 231 of the conductive material 23a of the central portion 26 (or the top surface 231 of the conductive material 23 of the substrate 2), the top surface 731 of the second electrode 73 and the top surface 721 of the intermediate layer 72. In addition, the capacitor 7 may include an upper portion 74 and a lower portion 75 below the upper portion 74, and the upper portion 74 of the capacitor 7 may be exposed from the top surface 21 of the substrate 2.

Further, the first electrode 71 may be disposed below the conductive material 23a of the central portion 26 and below the upper portion 25 of the filling material 27. That is, an elevation of a top surface 711 of the first electrode 71 may be lower than an elevation of a bottom surface 232 of the conductive material 23a of the central portion 26 and below a bottom surface 252 of the upper portion 25 of the filling material 27. The upper portion 74 of the capacitor 7 may not include the first electrode 71. In some embodiments, only the lower portion 75 may be designated as a capacitor.

The upper structure 3 may be disposed on the top surface 21 of the substrate 2, and may defines a hole 36. The upper structure 3 may have a top surface 31 and a bottom surface 32 opposite to the top surface 31. The bottom surface 32 of the upper structure 3 may contact the top surface 21 of the substrate 2. The top surface 31 of the upper structure 3 may be a substantially flat plane. The entire top surface 31 of the upper structure 3 may be at a same elevation from a cross-sectional view. The entire top surface 31 of the upper structure 3 may be the topmost surface 31.

The upper structure 3 may include a bottom insulation layer 33, a conductive layer 34 and a top insulation layer 35. The bottom insulation layer 33 may be disposed on the top surface 21 of the substrate 2. In some embodiments, the bottom insulation layer 33 may include a dielectric material or an insulation material, such as nitride, oxide, oxynitride amorphous silicon, polycrystalline silicon, or other suitable material. The bottom insulation layer 33 may have a thickness $T_3$.

The conductive layer 34 may be disposed on the bottom insulation layer 33. In some embodiments, the conductive layer 34 may include a suitable conductive material such as tungsten (W), copper (Cu), aluminum (Al), silver (Ag), an alloy thereof, or a combination thereof. In some embodiments, the conductive layer 34 may include signal lines, such as word lines. The conductive layer 34 may have a thickness $T_4$.

The top insulation layer 35 may be disposed on the conductive layer 34 (e.g. the word line). In some embodiments, the top insulation layer 35 may include a dielectric material or an insulation material, such as nitride, oxide, oxynitride amorphous silicon, polycrystalline silicon, or other suitable material. The material of the top insulation layer 35 may be same as or different from the material of the bottom insulation layer 33. The top insulation layer 35 may have a consistent thickness $T_5$. In some embodiments, the thickness $T_5$ of the top insulation layer 35 may be 55 nm.

The hole 36 may extend through the upper structure 3. That is, the hole 36 may extend between the top surface 31 of the upper structure 3 and the bottom surface 32 of the upper structure 3, and may extend through the bottom insulation layer 33, the conductive layer 34 (e.g. the word line) and the top insulation layer 35. The hole 36 may be located right above the conductive material 23a of the central portion 26. Thus, the top surface 231 of the conductive material 23a of the central portion 26 (or a top surface 231 of the conductive material 23 of the substrate 2) may be exposed from the hole 36. The hole 36 may be stopped by the conductive material 23a of the central portion 26. A width of the hole 36 may be less than a width of the conductive material 23a of the central portion 26. A central axis of the hole 36 may be aligned with a central axis of the conductive material 23a of the central portion 26. Thus, a portion of the top surface 231 of the conductive material 23a of the central portion 26 (or a top surface 231 of the conductive material 23 of the substrate 2) may be a bottom wall of the hole 36.

The vertical transistor 4 may be disposed in the hole 36 and on the substrate 2. Thus, the vertical transistor 4 may extend through the bottom insulation layer 33 and the conductive layer 34 (e.g. the word line). Further, a vertical projection of the vertical transistor 4 may be within the central portion 26, and the second electrode 73 of the capacitor 7 may be located outside the vertical projection of the vertical transistor 4. As shown in FIG. 1A, the vertical transistor 4 may include a main material 43, a periphery insulation layer 44 and a top conductive layer 45. The main material 43 may be a conductive material such as indium-gallium-zinc oxide (IGZO). A bottom end of the main material 43 may contact the conductive material 23a of the central portion 26. Thus, the vertical transistor 4 is electrically connected to the capacitor 7 through the conductive material 23a of the central portion 26 surrounded by the second electrode 73 of the capacitor 7.

The periphery insulation layer 44 may surround the main material 43, and may be interposed between the main material 43 and the sidewall of the hole 36. Thus, the main material 43 may be electrically insulated from the conductive layer 34. In some embodiments, the periphery insulation layer 44 may not cover the top surface and the bottom surface of the main material 43. The periphery insulation layer 44 may include an insulation material or dielectric material such as gate oxide (GOX). The top conductive layer 45 may cover and contact the top surface of the periphery insulation layer 44 and the top surface of the main material 43. Thus, the top conductive layer 45 may be electrically connected to the main material 43. The top conductive layer 45 may include transparent conductive oxide (TCO) material, such as indium tin oxide (ITO) and zinc oxide (ZnO). In some embodiments, the top conductive layer 45 may be omitted.

A height H of the vertical transistor 4 may be less than a depth D of the hole 36 so as to define a recess 37 above the vertical transistor 4 in the hole 36. The recess 37 may be a portion of the hole 36. The recess 37 may be a complete rectangular shape from the cross-sectional view. That is, two opposite top edges 371, 372 (or corners) of the recess 37 may be at the same elevation.

The electrical pad 5 may be disposed in the recess 37 of the hole 36 and on the vertical transistor 4. In some embodiments, the electrical pad 5 may include a suitable conductive material such as tungsten (W), copper (Cu), aluminum (Al), silver (Ag), an alloy thereof, or a combination thereof. The electrical pad 5 may be also referred to as "a landing pad". The electrical pad 5 may have a top surface 51 and a bottom surface 52 opposite to the top surface 51. The bottom surface 52 of the electrical pad 5 may contact and electrically to the vertical transistor 4. The top surface 51 of the electrical pad 5 may be substantially aligned with a topmost surface 31 of the upper structure 3, and may be leveled with the top edges 371, 372 of the recess 37. Thus, the electrical pad 5 (e.g., the landing pad) has a consistent thickness $T_1$. In some embodiments, the thickness $T_1$ of the electrical pad 5 (e.g., the landing pad) may be 20 nm.

As shown in FIG. 1A, the height H of the vertical transistor 4 may be greater than a sum of a thickness $T_3$ of the bottom insulation layer 33 and a thickness $T_4$ of the conductive layer 34 (e.g. the word line). In addition, a sum of the height H of the vertical transistor 4 and the thickness $T_1$ of the electrical pad 5 (e.g., the landing pad) may be substantially equal to a sum of the thickness $T_3$ of the bottom insulation layer 33, the thickness $T_4$ of the conductive layer 34 (e.g. the word line) and the thickness $T_5$ of the top insulation layer 35.

The conductive structure 6 may be disposed on the upper structure 3 and electrically connected to the electrical pad 5. In some embodiments, the conductive structure 6 may include signal lines, such as bit lines. A first portion 65 of the conductive structure 6 may contact and cover the top insulation layer 35 of the upper structure 3. A second portion 66 of the conductive structure 6 may contact and cover the electrical pad 5 (e.g., the landing pad). Thus, the conductive structure 6 (e.g., the bit line) may be electrically connected to the electrical pad (e.g., the landing pad). The conductive structure 6 may have a bottom surface 62 contacting the top insulation layer 35. The bottom surface 62 of the conductive structure 6 (e.g., the bit line) may be substantially leveled with or substantially aligned with the top surface 51 of the electrical pad 5 (e.g., the landing pad).

The conductive structure 6 may include a lower portion 63 and an upper portion 64 disposed on the lower portion 63. In some embodiments, the lower portion 63 may include a suitable conductive material such as tungsten (W), copper (Cu), aluminum (Al), silver (Ag), an alloy thereof, or a combination thereof. The material of the lower portion 63 may be same as or different from the material of the electrical pad 5 (e.g., the landing pad).

A first portion 65 of the lower portion 63 may contact and cover the top insulation layer 35 of the upper structure 3. A second portion 66 of the lower portion 63 may contact and cover the electrical pad 5 (e.g., the landing pad). In some embodiments, the material of the lower portion 63 may be same as the material of the electrical pad 5 (e.g., the landing pad), and the lower portion 63 of the conductive structure 6 and the electrical pad 5 (e.g., the landing pad) may be formed integrally. That is, there may be no interface between the second portion 66 of the lower portion 63 of the conductive structure 6 and the electrical pad 5 (e.g., the landing pad). Alternatively, there may be an interface between the second portion 66 of the lower portion 63 of the conductive structure 6 and the electrical pad 5 (e.g., the landing pad). The upper portion 64 may include a dielectric material or an insulation material, such as nitride, oxide, oxynitride amorphous silicon, polycrystalline silicon, or other suitable material.

Figure 1D:
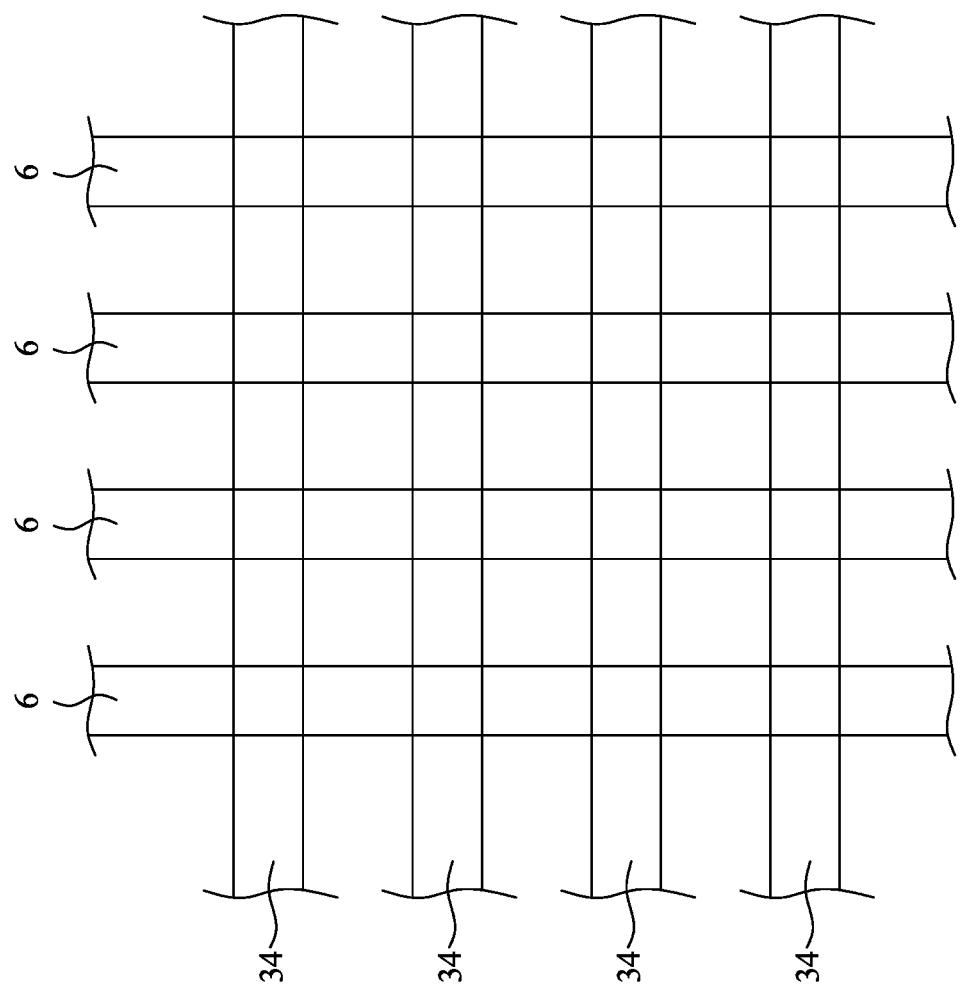
FIG. 1D is a schematic top view of an arrangement of the conductive structure and the conductive layer of FIG. 1A.

FIG. 1D is a schematic top view of an arrangement of the conductive structure 6 and the conductive layer 34 of FIG. 1A. As shown in FIG. 1D, an extension direction of the conductive layer 34 (e.g. the word line) may be perpendicular to an extension direction of the conductive structure 6 (e.g., the bit line).

In the embodiment illustrated in FIG. 1A to FIG. 1D, during a manufacturing process, the conductive structure 6 (e.g., the bit line) may be formed on the electrical pad 5 (e.g., the landing pad) directly. In a comparative embodiment, a landing pad structure is formed by two times of self-align double patterning (SADP), which results in complicated manufacturing process and high manufacturing cost. In comparison, the manufacturing process of the semiconductor structure 1 of the embodiment illustrated in FIG. 1A to FIG. 1D is simplified, which results in a lower manufacturing cost.

FIG. 2 to FIG. 9 illustrate various stages of a method of manufacturing a semiconductor structure 1, in accordance with some embodiments of the present disclosure.

Figure 2:
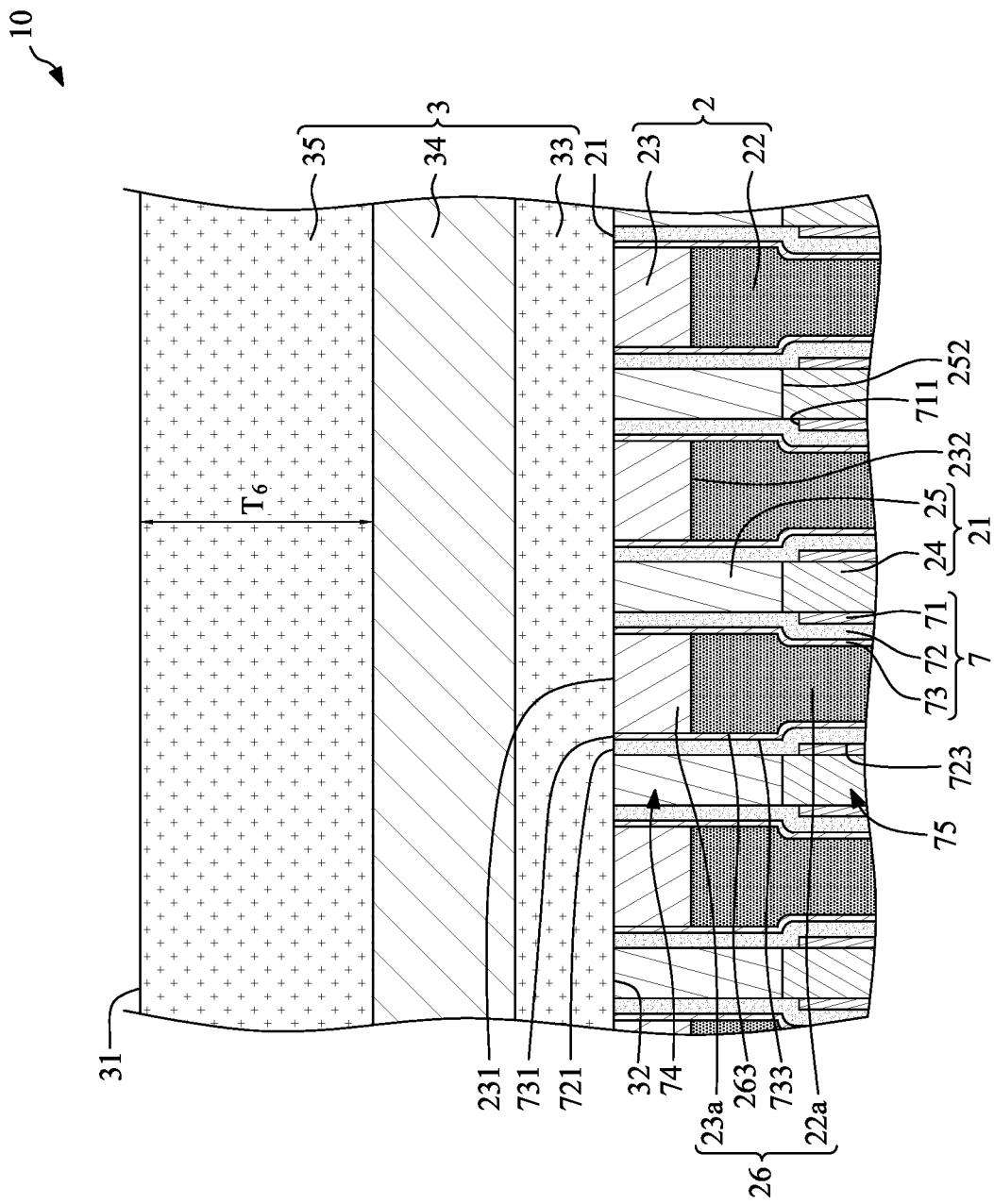
FIG. 2 illustrates one stage of a method of manufacturing a semiconductor structure, in accordance with some embodiments of the present disclosure.

FIG. 2 illustrates one stage of a method of manufacturing a semiconductor structure 1, in accordance with some embodiments of the present disclosure. A stacked structure 10 may be provided. The stacked structure 10 may include a substrate 2 and an upper structure 3 disposed on the substrate 2. The substrate 2 of FIG. 2 may be same as or similar to the substrate 2 of FIG. 1A. In some embodiments, the substrate 2 may have a top surface 21, and may include a base portion 22, a conductive material 23 on the base portion 22 and at least one capacitor 7. The capacitor 7 may be embedded in the substrate 2. In some embodiments, the capacitor 7 may be a vertical ring structure and surrounds a central portion 26. The central portion 26 may be in a cylinder shape, and may include a base material 22a and a conductive material 23a. The base material 22a of the central portion 26 may be a portion of the base portion 22 of the substrate 2. The conductive material 23a of the central portion 26 may be a portion of the conductive material 23 of the substrate 2.

The capacitor 7 of FIG. 2 may be same as or similar to the capacitor 7 of FIG. 1A, and may include a first electrode 71 (e.g., a bottom electrode), an intermediate layer 72 and a second electrode 73 (e.g., a top electrode). It is contemplated that the number of the capacitor 7 is not limited. There may be a plurality of capacitors 7 in the substrate 2. The substrate 2 may further include filling material 27 between the capacitors 7. The filling material 27 may include a lower portion 24 and an upper portion 25 disposed on the lower portion 24.

In some embodiments, the conductive material 23a of the central portion 26 contacts the second electrode 73. As shown in FIG. 2, the top surface 21 of the substrate 2 may include the top surface 231 of the conductive material 23a of the central portion 26 (or the top surface 231 of the conductive material 23 of the substrate 2), the top surface 731 of the second electrode 73 and the top surface 721 of the intermediate layer 72. In addition, the capacitor 7 may include an upper portion 74 and a lower portion 75 below the upper portion 74, and the upper portion 74 of the capacitor 7 may be exposed from the top surface 21 of the substrate 2. In some embodiments, only the lower portion 75 may be designated as a capacitor.

The upper structure 3 of FIG. 2 may be same as or similar to the upper structure 3 of FIG. 1A, and may include a bottom insulation layer 33, a conductive layer 34 and a top insulation layer 35. The bottom insulation layer 33 may be disposed on the top surface 21 of the substrate 2. The conductive layer 34 may be disposed on the bottom insulation layer 33. In some embodiments, the conductive layer 34 may include signal lines, such as word lines. The top insulation layer 35 may be disposed on the conductive layer 34 (e.g. the word line). The top insulation layer 35 may have a consistent thickness $T_6$. In some embodiments, the thickness $T_6$ of the top insulation layer 35 may be 70 nm.

Figure 3:
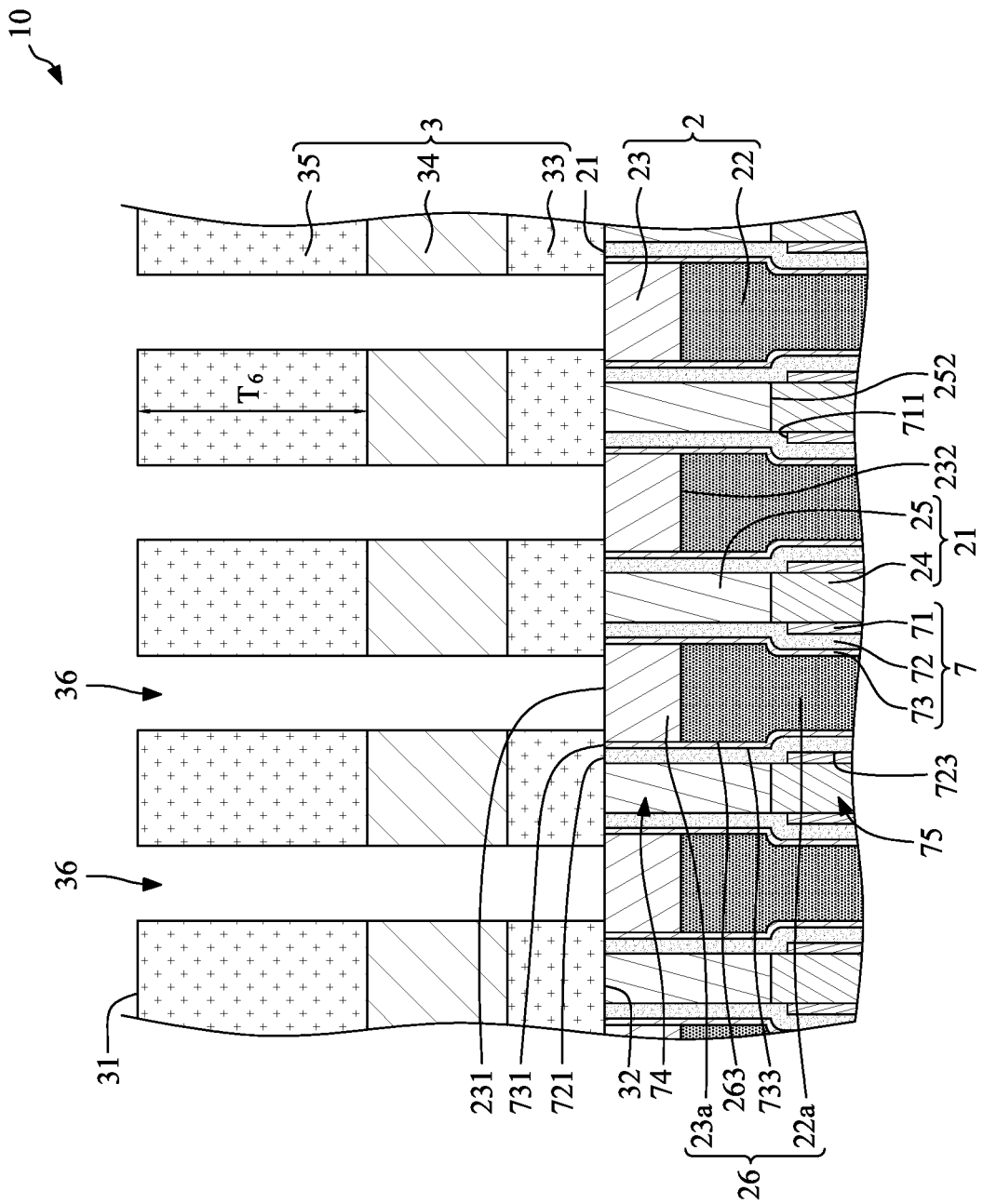
FIG. 3 illustrates one stage of a method of manufacturing a semiconductor structure, in accordance with some embodiments of the present disclosure.

FIG. 3 illustrates one stage of a method of manufacturing a semiconductor structure 1, in accordance with some embodiments of the present disclosure. At least one hole 36 may be formed to extend through the upper structure 3 by, for example, dry etching. Thus, the hole 36 may extend between the top surface 31 of the upper structure 3 and the bottom surface 32 of the upper structure 3, and may extend through the bottom insulation layer 33, the conductive layer 34 (e.g. the word line) and the top insulation layer 35. The hole 36 may be located right above the conductive material 23a of the central portion 26. Thus, the top surface 231 of the conductive material 23a of the central portion 26 (or a top surface 231 of the conductive material 23 of the substrate 2) may be exposed from the hole 36. A width of the hole 36 may be less than a width of the conductive material 23a of the central portion 26.

Figure 4:
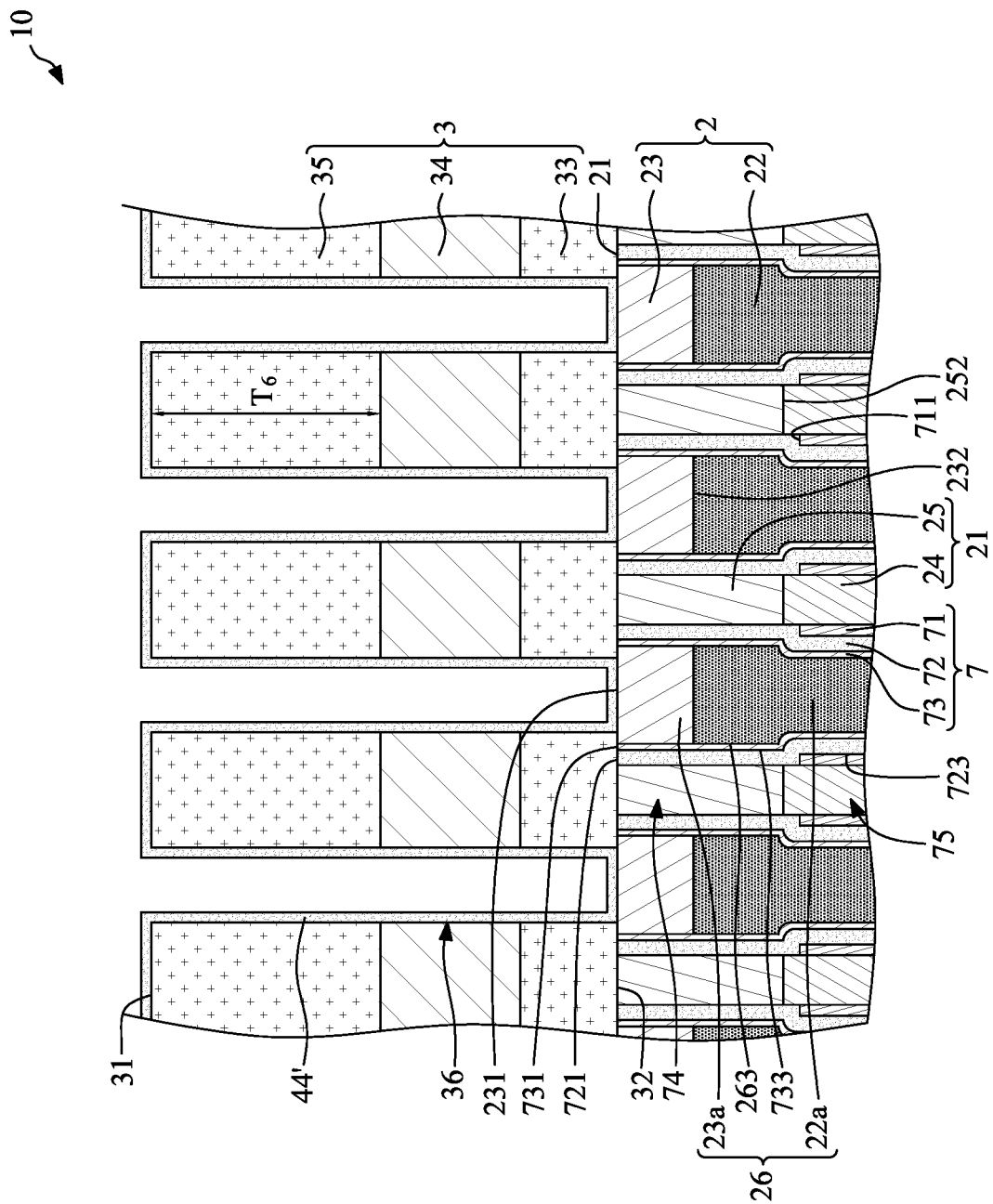
FIG. 4 illustrates one stage of a method of manufacturing a semiconductor structure, in accordance with some embodiments of the present disclosure.

FIG. 4 illustrates one stage of a method of manufacturing a semiconductor structure 1, in accordance with some embodiments of the present disclosure. An insulation layer 44' may be formed on the top surface 31 of the upper structure 3 and in the hole 36 by, for example, deposition. The insulation layer 44' may include an insulation material or dielectric material such as gate oxide (GOX).

Figure 5:
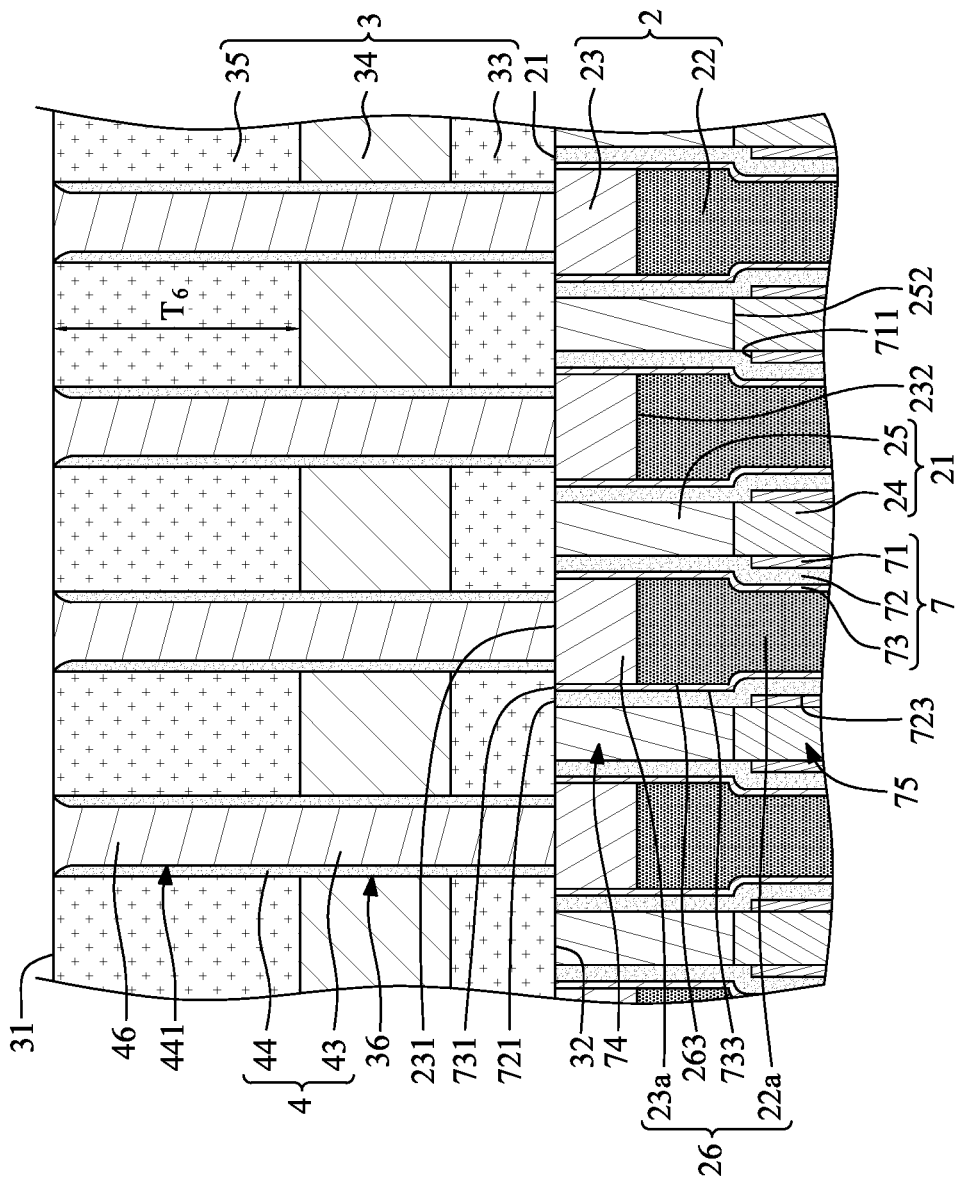
FIG. 5 illustrates one stage of a method of manufacturing a semiconductor structure, in accordance with some embodiments of the present disclosure.

FIG. 5 illustrates one stage of a method of manufacturing a semiconductor structure 1, in accordance with some embodiments of the present disclosure. The portion of the insulation layer 44' on the top surface 31 of the upper structure 3 and on the bottom wall of the hole 36 are removed so as to become to the periphery insulation layer 44 on the sidewall of the hole 36. Then, a main material 43 may be formed in the central hole 441 defined by the periphery insulation layer 44. The main material 43 may include a conductive material such as indium-gallium-zinc oxide (IGZO). Meanwhile, a vertical transistor 4 (including the main material 43 and the periphery insulation layer 44) may be formed in the hole 36. The vertical transistor 4 may include an upper portion 46 adjacent to the top surface 31 of the top insulation layer 35.

Figure 6:
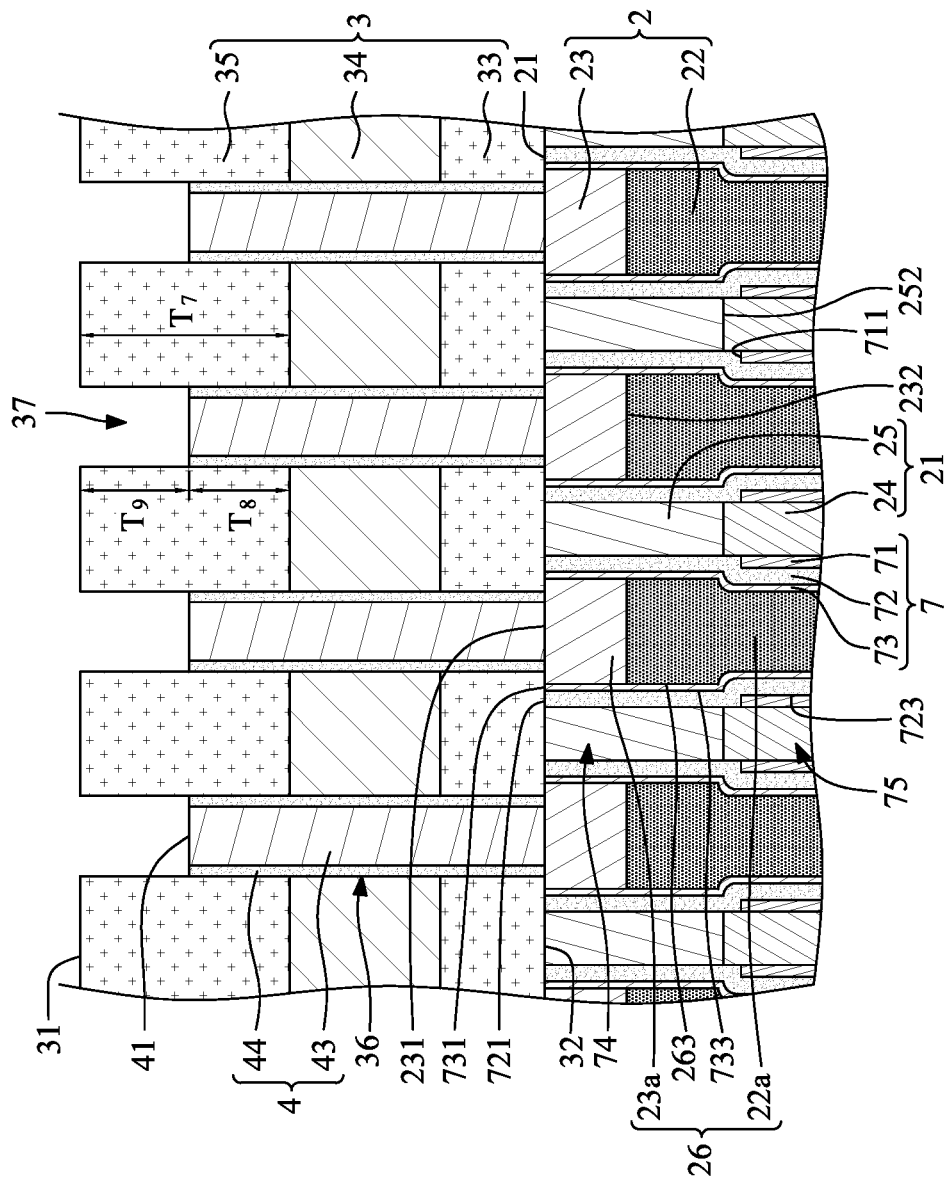
FIG. 6 illustrates one stage of a method of manufacturing a semiconductor structure, in accordance with some embodiments of the present disclosure.

FIG. 6 illustrates one stage of a method of manufacturing a semiconductor structure 1, in accordance with some embodiments of the present disclosure. The upper portion 46 of the vertical transistor 4 may be removed to form a recess 37. Meanwhile, the vertical transistor 4 may be shortened, and the top insulation layer 35 may be thinned. The vertical transistor 4 may have a top surface 41. The recess 37 may be located above the top surface 41 of the vertical transistor 4, and recessed from the top surface 31 of the top insulation layer 35. As shown in FIG. 6, the top insulation layer 35 may have a thickness $T_7$, which may be 60 nm. The thickness $T_7$ of the top insulation layer 35 may be a sum of a depth $T_9$ of the recess 37 and a height $T_8$ of the portion of the vertical transistor 4 embedded in the top insulation layer 35. The depth $T_9$ of the recess 37 may be equal to a vertical distance between the top surface 31 of the top insulation layer 35 and the top surface 41 of the vertical transistor 4, and may be 30 nm. The height $T_8$ of the portion of the vertical transistor 4 embedded in the top insulation layer 35 may be a vertical distance between the top surface 41 of the vertical transistor 4 and the bottom surface of the top insulation layer 35.

Figure 7:
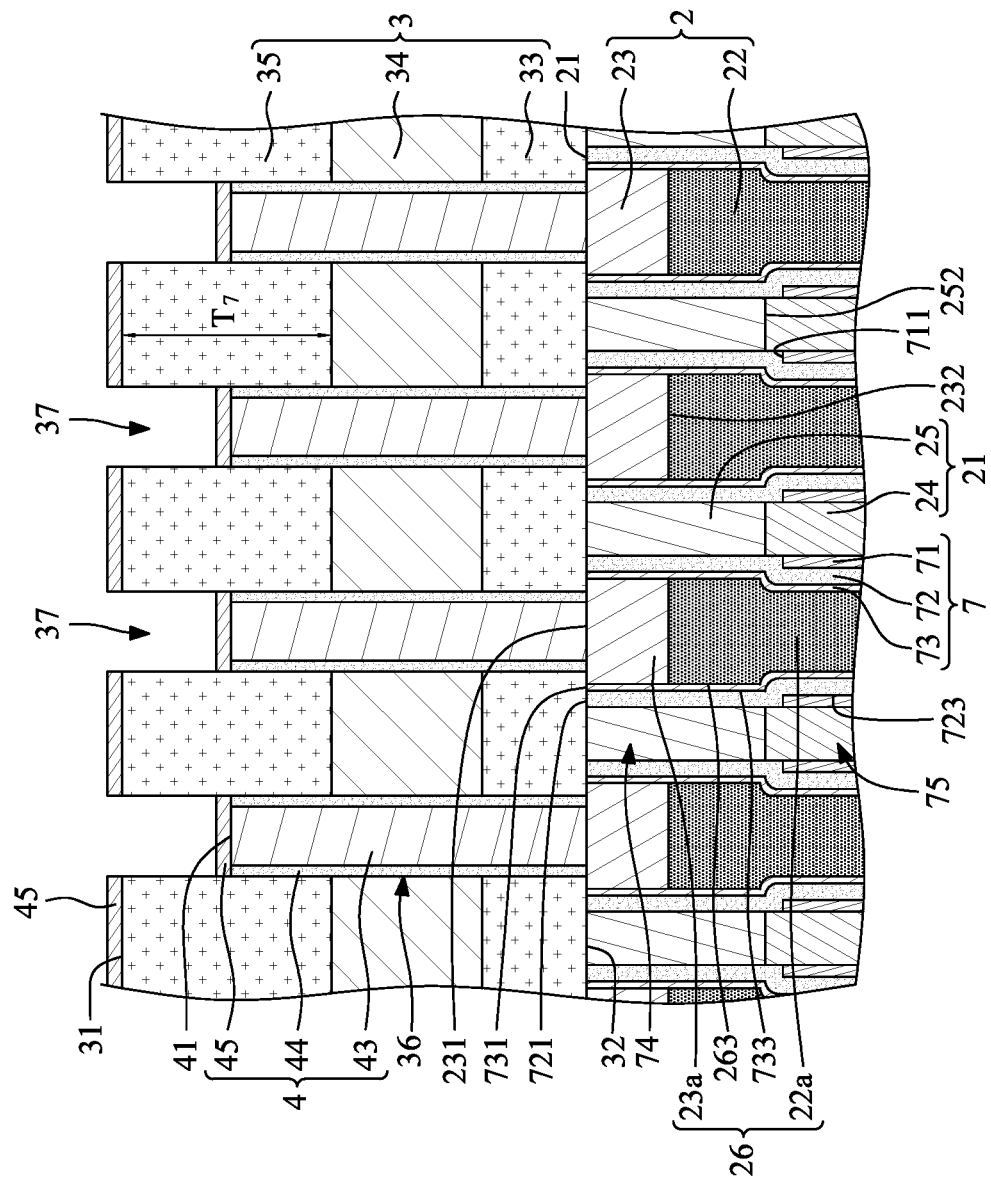
FIG. 7 illustrates one stage of a method of manufacturing a semiconductor structure, in accordance with some embodiments of the present disclosure.

FIG. 7 illustrates one stage of a method of manufacturing a semiconductor structure 1, in accordance with some embodiments of the present disclosure. A top conductive layer 45 may be formed on the top surface 31 of the top insulation layer 35 and on the top surface 41 of the vertical transistor 4 by, for example, physical vapor deposition (PVD). The portion of the top conductive layer 45 on the top surface 41 of the vertical transistor 4 may be electrically connected to the main material 43. The top conductive layer 45 may include transparent conductive oxide (TCO) material, such as indium tin oxide (ITO) and zinc oxide (ZnO). A thickness of the top conductive layer 45 may be 5 nm.

Figure 8:
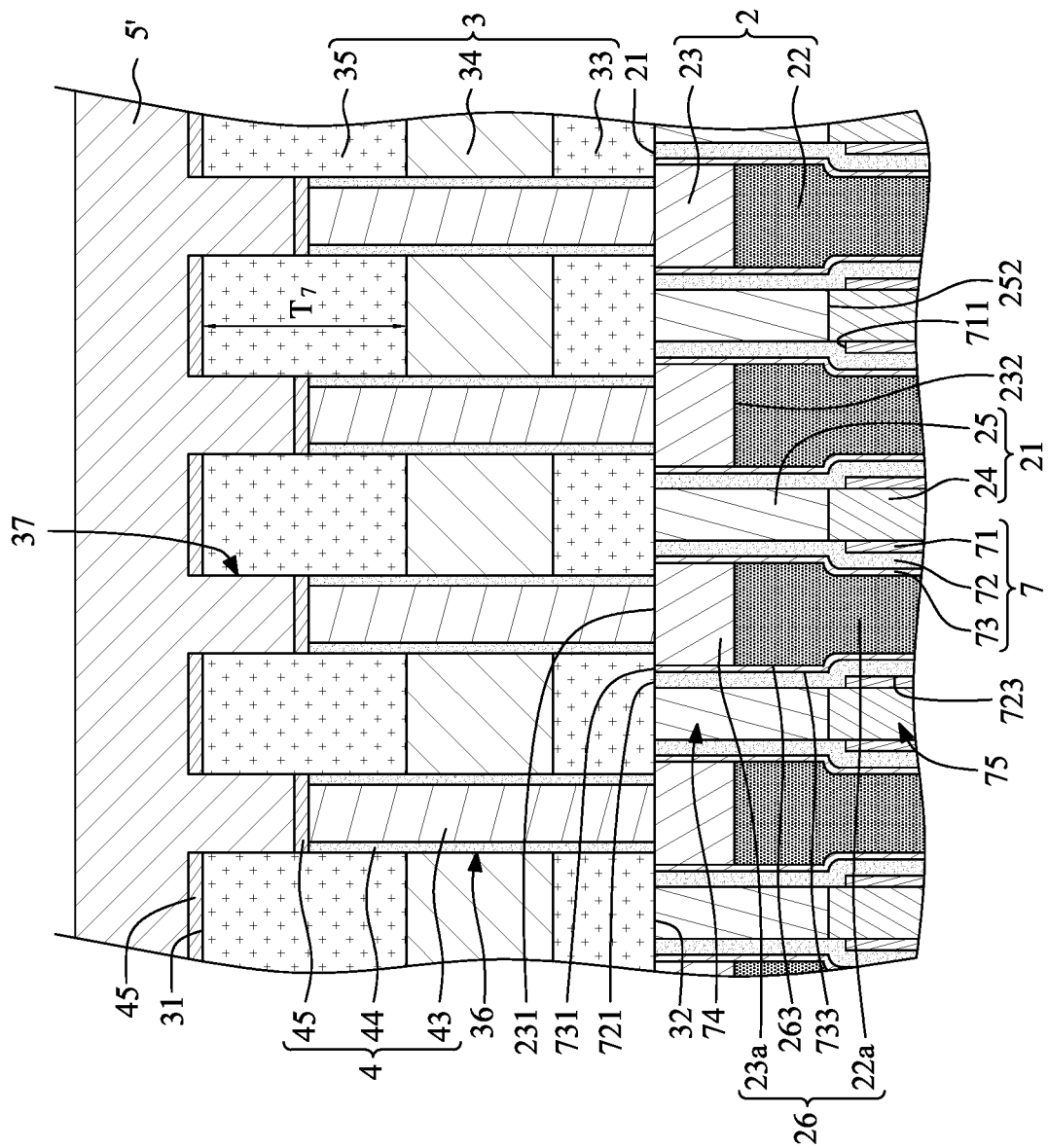
FIG. 8 illustrates one stage of a method of manufacturing a semiconductor structure, in accordance with some embodiments of the present disclosure.

FIG. 8 illustrates one stage of a method of manufacturing a semiconductor structure 1, in accordance with some embodiments of the present disclosure. A conductive material 5' may be formed to cover the top conductive layer 45 by, for example, chemical vapor deposition (CVD). A portion of the conductive material 5' may be disposed on the top conductive layer 45 on the top surface 31 of the top insulation layer Another portion of the conductive material 5' may extend into the recess 37 and may be disposed on the top conductive layer 45 on the top surface 41 of the vertical transistor 4.

Figure 9:
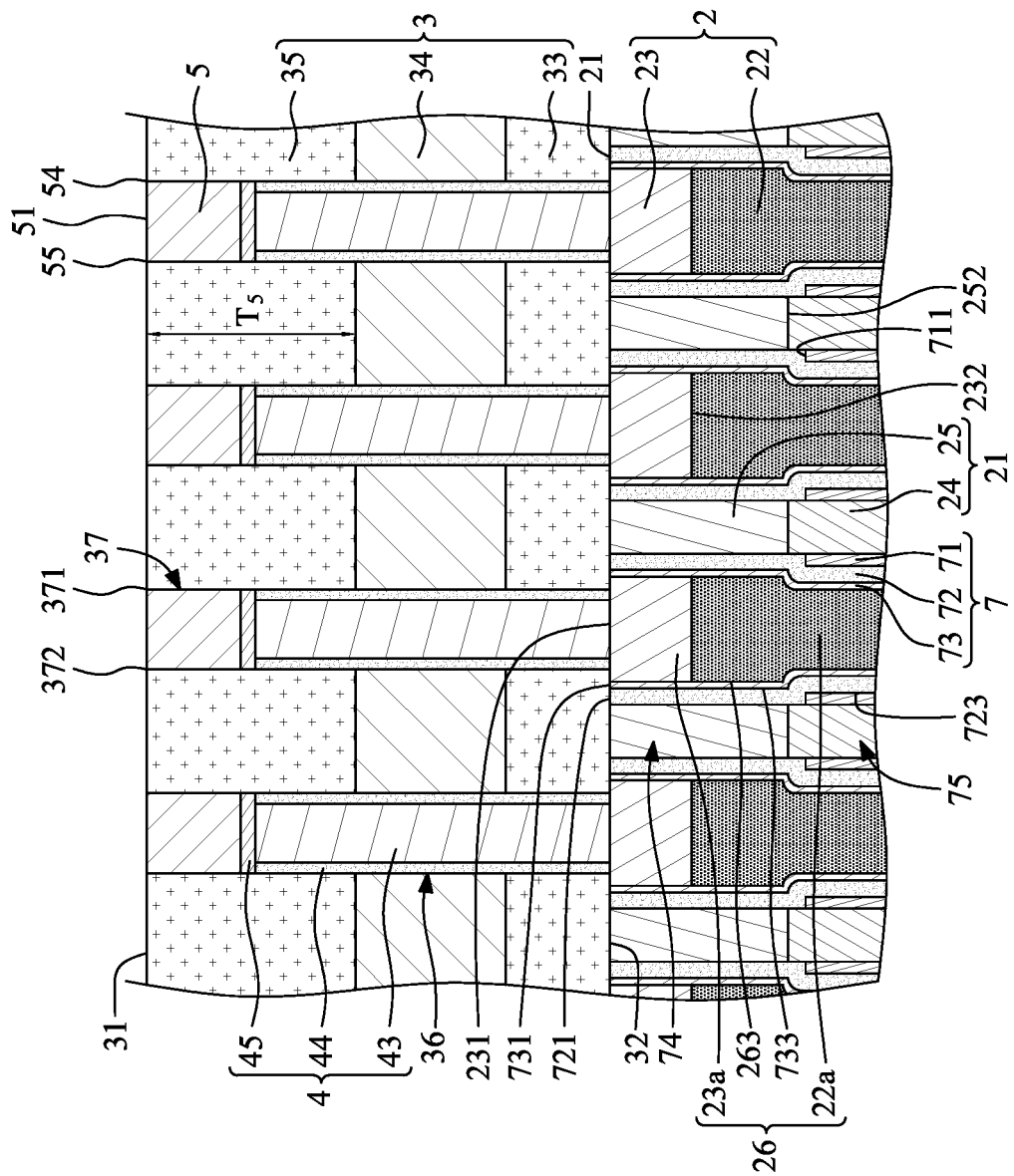
FIG. 9 illustrates one stage of a method of manufacturing a semiconductor structure, in accordance with some embodiments of the present disclosure.

FIG. 9 illustrates one stage of a method of manufacturing a semiconductor structure 1, in accordance with some embodiments of the present disclosure. A removing process, for example, chemical mechanical polishing (CMP) may be conducted to the conductive material 5' and the top conductive layer 45 on the top surface 31 of the top insulation layer 35. Thus, the conductive material 5' and the top conductive layer 45 above the top surface 31 of the top insulation layer may be removed. Further, a portion of the top insulation layer 35 may be also removed. The top insulation layer 35 may be thinned to have a thickness $T_5$ of 55 nm. In some embodiments, the portion of the conductive material 5' remaining in the recess 37 may become an electrical pad 5 (e.g., the landing pad). Thus, the electrical pad 5 (e.g., the landing pad) may be formed or disposed in the recess 37. Alternatively, the electrical pad 5 (e.g., the landing pad) may be formed or disposed in the hole 36 and on the vertical transistor 4.

The electrical pad 5 (e.g., the landing pad) may have a top surface 51. The top surface 51 of the electrical pad (e.g., the landing pad) may be substantially aligned with or substantially coplanar with the top surface 31 of the upper structure 3 (e.g., the top surface of the top insulation layer 35). The electrical pad 5 (e.g., the landing pad) may have two opposite top corners 54, 55 adjacent to the top surface 51 and at the same elevation. The recess 37 may have two opposite top edges 371, 372 (or corners) at the same elevation. The two opposite top corners 54, 55 of the electrical pad 5 (e.g., the landing pad) may correspond to the two opposite top edges 371, 372 (or corners) of the recess 37, respectively.

Then, a conductive structure 6 may be formed or disposed on the electrical pad 5 (e.g., the landing pad) and the upper structure 3 so as to form the semiconductor structure 1 as shown in FIG. 1A. In some embodiments, the conductive structure 6 may include signal lines, such as bit lines. A first portion 65 of the conductive structure 6 may contact and cover the top surface 31 of the upper structure 3 (i.e., the top surface of the top insulation layer 35). A second portion 66 of the conductive structure 6 may contact and cover the electrical pad 5 (e.g., the landing pad). Thus, the conductive structure 6 (e.g., the bit line) may be electrically connected to the electrical pad 5 (e.g., the landing pad). The conductive structure 6 may have a bottom surface 62 contacting the top insulation layer 35. The bottom surface 62 of the conductive structure 6 (e.g., the bit line) may be substantially leveled with or substantially aligned with the top surface 51 of the electrical pad 5 (e.g., the landing pad) and the top surface 31 of the upper structure 3 (i.e., the top surface of the top insulation layer 35).

In some embodiments, the conductive structure 6 may be formed or disposed on the electrical pad 5 (e.g., the landing pad) directly. Thus, the top corners 54, 55 of the electrical pad 5 (e.g., the landing pad) and the top edges 371, 372 (or corners) of the recess 37 are free from damage. That is, during the formation of the conductive structure 6, the top corners 54, 55 of the electrical pad 5 (e.g., the landing pad) and the top edges 371, 372 (or corners) of the recess 37 may be not damaged. No portion of the top corners 54, 55 of the electrical pad 5 (e.g., the landing pad) and the top edges 371, 372 (or corners) of the recess 37 may be removed. Each of the electrical pad 5 (e.g., the landing pad) and the recess 37 may be a complete rectangular shape from the cross-sectional view. There is no additional groove or trench formed to be recessed from the top surface 51 of the electrical pad 5 (e.g., the landing pad) and the top surface 31 of the upper structure 3 (i.e., the top surface of the top insulation layer 35).

The conductive structure 6 may include a lower portion 63 and an upper portion 64 disposed on the lower portion 63. In some embodiments, the lower portion 63 may include a suitable conductive material such as tungsten (W), copper (Cu), aluminum (Al), silver (Ag), an alloy thereof, or a combination thereof. The material of the lower portion 63 may be same as or different from the material of the electrical pad 5 (e.g., the landing pad).

A first portion 65 of the lower portion 63 may contact and cover the top insulation layer 35 of the upper structure 3. A second portion 66 of the lower portion 63 may contact and cover the electrical pad 5 (e.g., the landing pad). In some embodiments, the material of the lower portion 63 may be same as the material of the electrical pad 5 (e.g., the landing pad), and the lower portion 63 of the conductive structure 6 and the electrical pad 5 (e.g., the landing pad) may be formed integrally. That is, there may be no interface between the second portion 66 of the lower portion 63 of the conductive structure 6 and the electrical pad 5 (e.g., the landing pad). Alternatively, there may be an interface between the second portion 66 of the lower portion 63 of the conductive structure 6 and the electrical pad 5 (e.g., the landing pad). The upper portion 64 may include a dielectric material or an insulation material, such as nitride, oxide, oxynitride amorphous silicon, polycrystalline silicon, or other suitable material.

Figure 10:
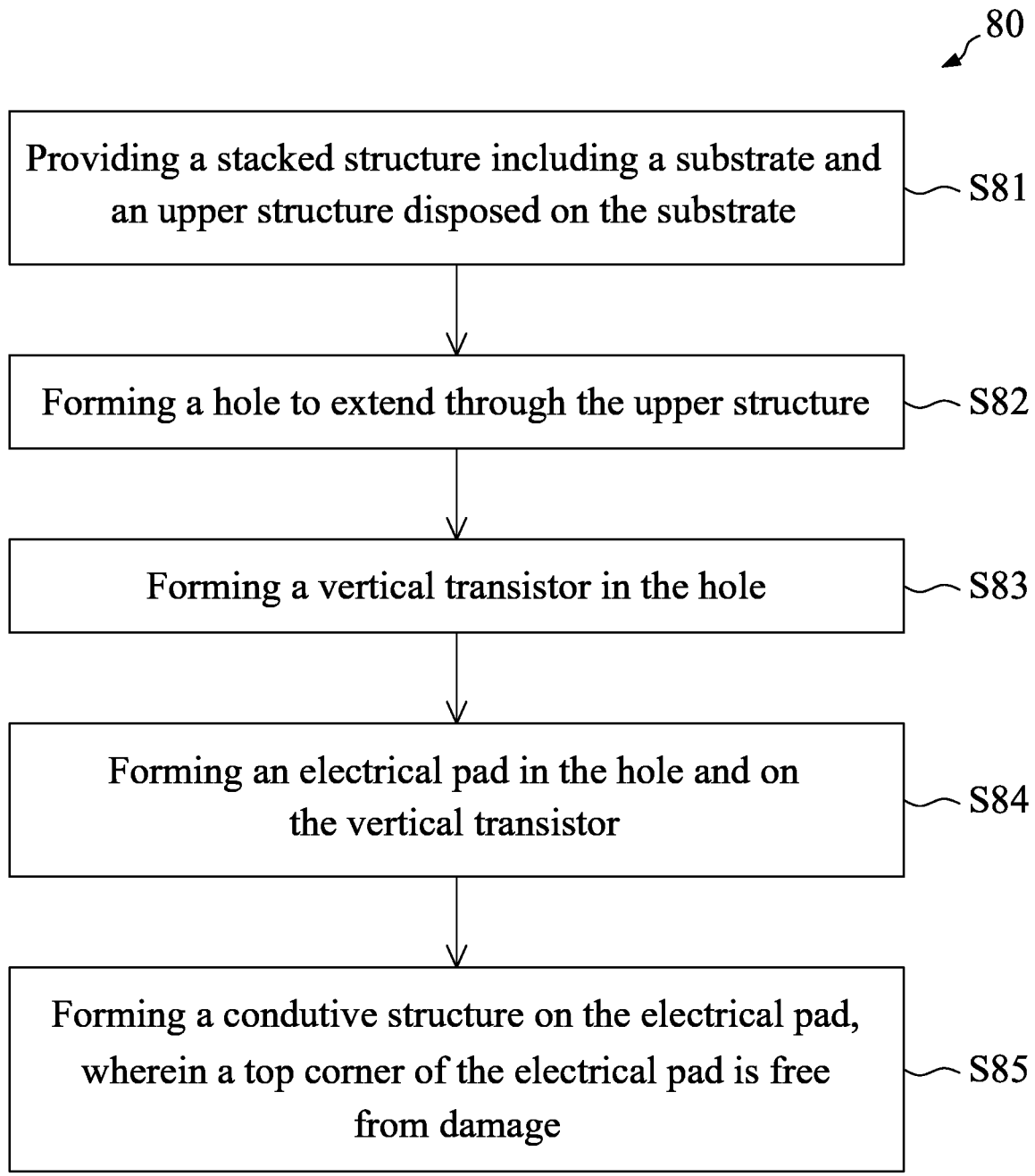
FIG. 10 is a flowchart of a method of manufacturing a semiconductor structure, in accordance with some embodiments of the present disclosure.

FIG. 10 illustrates a flow chart of a method 80 of manufacturing a semiconductor structure 1 in accordance with some embodiments of the present disclosure.

In some embodiments, the method 80 may include a step S81, providing a stacked structure including a substrate and an upper structure disposed on the substrate. For example, as shown in FIG. 2, the stacked structure 10 may be provided and may include a substrate 2 and an upper structure 3 disposed on the substrate 2.

In some embodiments, the method 80 may include a step S82, forming a hole to extend through the upper structure. For example, as shown in FIG. 3, the hole 36 may be formed to extend through the upper structure 3 to expose the top surface 21 of the substrate 2.

In some embodiments, the method 80 may include a step S83, forming a vertical transistor in the hole. For example, as shown in FIG. 5, the vertical transistor 4 may be formed in the hole 36. Then, an upper portion 46 of the vertical transistor 4 may be removed to form a recess 37 in the hole 36, as shown in FIG. 6.

In some embodiments, the method 80 may include a step S84, forming an electrical pad in the hole and on the vertical transistor. For example, as shown in FIG. 9, the electrical pad 5 (e.g., the landing pad) may be formed or disposed in the recess 37 and in the hole 36 and on the vertical transistor 4.

In some embodiments, the method 80 may include a step S85, forming a conductive structure on the electrical pad, wherein a top corner of the electrical pad is free from damage. For example, as shown in FIG. 1A, the conductive structure 6 may be formed on the electrical pad 5 (e.g., the landing pad), wherein a top corner 54, 55 of the electrical pad electrical pad 5 (e.g., the landing pad) may be free from damage. That is, during the formation of the conductive structure 6, the top corners 54, 55 of the electrical pad 5 (e.g., the landing pad) may be not damaged. No portion of the top corners 54, 55 of the electrical pad (e.g., the landing pad) may be removed. Each of the electrical pad 5 (e.g., the landing pad) may be a complete rectangular shape from the cross-sectional view.

One aspect of the present disclosure provides a semiconductor structure including a substrate, an upper structure, a vertical transistor an electrical pad. The upper structure is disposed on the substrate and defines a hole. The vertical transistor is disposed in the hole. The electrical pad is disposed in the hole and on the vertical transistor. A top surface of the electrical pad is substantially aligned with a topmost surface of the upper structure.

Another aspect of the present disclosure provides a semiconductor structure including a substrate, a vertical transistor, an electrical pad and a bit line. The substrate includes a capacitor. The vertical transistor is disposed on the substrate, and electrically connected to the capacitor. The electrical pad is disposed on the vertical transistor. The electrical pad has a consistent thickness. The bit line is electrically connected to the electrical pad.

Another aspect of the present disclosure provides a method of manufacturing a semiconductor structure. The method includes providing a stacked structure including a substrate and an upper structure disposed on the substrate. The method also includes forming a hole to extend through the upper structure. The method also includes forming a hole to extend through the upper structure. The method also includes forming a vertical transistor in the hole. The method also includes forming an electrical pad in the hole and on the vertical transistor. The method also includes forming a conductive structure on the electrical pad, wherein a top corner of the electrical pad is free from damage.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
a substrate comprising a conductive material indented on a top surface of the substrate;
an upper structure disposed on the top surface of the substrate and defining a hole to expose a portion of a top surface of the conductive material;
a vertical transistor disposed in the hole and in contact with the top surface of the conductive material; and
an electrical pad disposed in the hole and on the vertical transistor, wherein a top surface of the electrical pad is substantially aligned with a topmost surface of the upper structure.

2. The semiconductor structure of claim 1, wherein the substrate comprises a capacitor disposed therein and embedded in the top surface of the substrate.

3. The semiconductor structure of claim 2, wherein the capacitor is a ring structure and surrounds a central portion, wherein the central portion is constructed to have a base material and the conductive material disposed on the base material and electrically connected to the vertical transistor.

4. The semiconductor structure of claim 3, wherein the capacitor includes a first electrode, an intermediate layer and a second electrode, the second electrode is disposed on a lateral surface of the central portion, the intermediate layer is disposed on a lateral surface of the second electrode, and the first electrode is disposed on the lateral surface of the intermediate layer.

5. The semiconductor structure of claim 4, wherein the conductive material of the central portion contacts the second electrode.

6. The semiconductor structure of claim 5, wherein the top surface of the substrate, a top surface of the conductive material of the central portion, a top surface of the second electrode and a top surface of the intermediate layer are substantially coplanar with each other.

7. The semiconductor structure of claim 4, wherein the first electrode is disposed below the conductive material of the central portion.

8. The semiconductor structure of claim 3, wherein a vertical projection of the vertical transistor is within the central portion.

9. The semiconductor structure of claim 1, wherein the upper structure includes a bottom insulation layer disposed on the substrate, a conductive layer disposed on the bottom insulation layer and a top insulation layer disposed on the conductive layer.

10. The semiconductor structure of claim 1, wherein the hole extends through the upper structure, and a height of the vertical transistor is less than a depth of the hole so as to define a recess above the vertical transistor in the hole, wherein the electrical pad is disposed in the recess and contacts the vertical transistor, wherein the hole is coaxially aligned with the conductive material, wherein a width of the hole is less than a width of the conductive material.

11. The semiconductor structure of claim 10, wherein the recess is a complete rectangular shape from a cross-sectional view, and two opposite top edges of the recess are at the same elevation.

12. The semiconductor structure of claim 1, further comprising a conductive structure disposed on the upper structure and electrically connected to the electrical pad.

13. The semiconductor structure of claim 12, wherein a portion of the conductive structure contacts a top insulation layer of the upper structure, a bottom surface of the conductive structure is leveled with a top surface of the electrical pad, and the conductive structure includes a lower portion and an upper portion, and the lower portion of the conductive structure and the electrical pad are formed integrally.

14. A semiconductor structure, comprising:
a substrate comprising a capacitor and a conductive material surrounded by the capacitor;
a vertical transistor disposed on the substrate, and electrically connected to the capacitor via the conductive material, wherein the vertical transistor is coaxially aligned with the conductive material, wherein a width of the vertical transistor is less than a width of the conductive material, such that a width of the capacitor is larger than the width of the vertical transistor;
an electrical pad disposed on the vertical transistor, wherein the electrical pad has a consistent thickness; and
a bit line electrically connected to the electrical pad.

15. The semiconductor structure of claim 14, wherein the capacitor is a ring structure, and an upper portion of the capacitor is exposed from a top surface of the substrate, wherein the capacitor comprises a second electrode surrounding the conductive material, such that the vertical transistor is coaxially aligned with the second electrode.

16. The semiconductor structure of claim 15, wherein the second electrode of the capacitor is located outside a vertical projection of the vertical transistor;
wherein the vertical transistor comprises:
a main material coaxially aligned with the conductive material, wherein a bottom surface of the main material is in contact with the conductive material;
a periphery insulation layer coaxially surrounding a side surface of the main material;
a top conductive layer covering a top surface of the main material and a top surface of the periphery insulation layer, wherein the electrical pad is disposed on the top conductive layer.

17. The semiconductor structure of claim 14, further comprising:
a bottom insulation layer disposed on the substrate;
a word line disposed on the bottom insulation layer; and
a top insulation layer disposed on the word line.

18. The semiconductor structure of claim 17, wherein an extension direction of the word line is perpendicular to an extension direction of the bit line, and the vertical transistor extends through the bottom insulation layer and the word line.

19. The semiconductor structure of claim 17, wherein a height of the vertical transistor is greater than a sum of a thickness of the bottom insulation layer and a thickness of the word line, the top insulation layer has a consistent thickness, and a bottom surface of the bit line is substantially aligned with a top surface of the electrical pad.

20. The semiconductor structure of claim 17, wherein a sum of a height of the vertical transistor and the thickness of the electrical pad is substantially equal to a sum of a thickness of the bottom insulation layer, a thickness of the word line and a thickness of the top insulation layer.

* * * * *